(12) United States Patent
Teh et al.

(10) Patent No.: US 9,162,867 B2
(45) Date of Patent: Oct. 20, 2015

(54) THROUGH-SILICON VIA RESONATORS IN CHIP PACKAGES AND METHODS OF ASSEMBLING SAME

(75) Inventors: Weng Hong Teh, Phoenix, AZ (US); Robert Bob L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,122

(22) PCT Filed: Dec. 13, 2011

(86) PCT No.: PCT/US2011/064567
§ 371 (c)(1),
(2), (4) Date: Jun. 28, 2013

(87) PCT Pub. No.: WO2013/089673
PCT Pub. Date: Jun. 20, 2013

(65) Prior Publication Data
US 2013/0284572 A1    Oct. 31, 2013

(51) Int. Cl.
*H01L 25/065* (2006.01)
*B81B 3/00* (2006.01)
(Continued)

(52) U.S. Cl.
CPC .............. *B81B 3/0021* (2013.01); *B81C 1/0015* (2013.01); *G01P 15/135* (2013.01); *H01H 1/0036* (2013.01); *H01L 23/481* (2013.01); *H01L 25/0657* (2013.01); *B81B 2201/014* (2013.01); *B81B 2201/0235* (2013.01); *B81B 2203/0118* (2013.01); *H01H 1/0094* (2013.01); *H01L 21/563* (2013.01); *H01L 23/13* (2013.01);
(Continued)

(58) Field of Classification Search
CPC .............. H01L 21/76898; H01L 2224/13009; H01L 24/09; H01L 24/02; H01L 23/481; H01L 25/0657; H01L 2225/06548; H01L 23/48; H01L 21/60; H01L 23/045; H01L 23/055; H01L 29/7613; B82Y 10/00
USPC ........... 257/415, 421, 499, 798, 53, 108, 414; 326/101, 104; 977/732, 940; 200/283; 438/52, 48, 53
See application file for complete search history.

(56) References Cited

U.S. PATENT DOCUMENTS 6,625,047 B2 *   9/2003   Coleman, Jr. .................... 365/51
7,414,437 B1 *   8/2008   Blick et al. ..................... 326/101
(Continued)

FOREIGN PATENT DOCUMENTS

WO    2013/089673 A1    6/2013

OTHER PUBLICATIONS

International Search Report received for International Application No. PCT/US2011/064567, mailed on Aug. 29, 2012, 9 pages.
(Continued)

*Primary Examiner* — Matthew Reames
*Assistant Examiner* — Vincent Wall
(74) *Attorney, Agent, or Firm* — John N. Greaves

(57) ABSTRACT

A process of forming a through-silicon via (TSV) in a die includes forming a movable member in the TSV that can be actuated or that can be a sensor. Action of the movable member in the TSV can result in a logic word being sent from the TSV die to a subsequent die. The TSV die may be embedded in a substrate. The TSV die may also be coupled to a subsequent die.

7 Claims, 12 Drawing Sheets

(51) Int. Cl.
*B81C 1/00* (2006.01)
*G01P 15/135* (2006.01)
*H01L 23/48* (2006.01)
*H01H 1/00* (2006.01)
*H01L 23/13* (2006.01)
*H01L 23/498* (2006.01)
*H01L 21/56* (2006.01)
*H01L 23/00* (2006.01)

(52) U.S. Cl.
CPC .......... *H01L 23/49816* (2013.01); *H01L 24/02* (2013.01); *H01L 24/05* (2013.01); *H01L 24/16* (2013.01); *H01L 24/17* (2013.01); *H01L 24/32* (2013.01); *H01L 24/92* (2013.01); *H01L 2223/6677* (2013.01); *H01L 2224/02372* (2013.01); *H01L 2224/0401* (2013.01); *H01L 2224/05008* (2013.01); *H01L 2224/16145* (2013.01); *H01L 2224/16148* (2013.01); *H01L 2224/17181* (2013.01); *H01L 2224/32145* (2013.01); *H01L 2224/73204* (2013.01); *H01L 2224/831* (2013.01); *H01L 2224/92125* (2013.01); *H01L 2225/06513* (2013.01); *H01L 2225/06517* (2013.01); *H01L 2225/06541* (2013.01); *H01L 2924/15311* (2013.01)

(56) References Cited

U.S. PATENT DOCUMENTS

| | | | |
|---|---|---|---|
| 7,910,473 | B2 | 3/2011 | Chen |
| 8,604,898 | B2 * | 12/2013 | Anderson et al. ............... 335/78 |
| 2009/0256594 | A1 | 10/2009 | Zhu |
| 2011/0062591 | A1 | 3/2011 | Choi et al. |
| 2011/0182111 | A1 | 7/2011 | Kim et al. |
| 2011/0228464 | A1 * | 9/2011 | Guzek et al. ............. 361/679.31 |

OTHER PUBLICATIONS

International Preliminary Report on Patentability received for PCT Patent Application No. PCT/US2011/064567, mailed on Jun. 26, 2014, 6 pages.

* cited by examiner

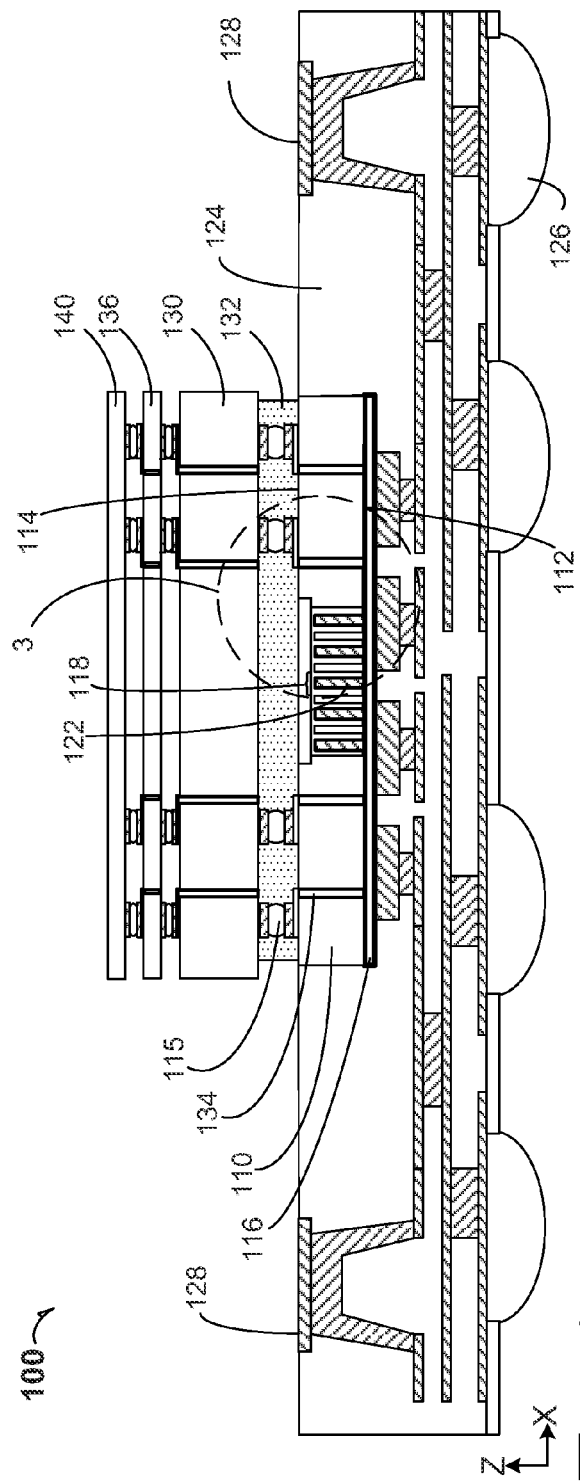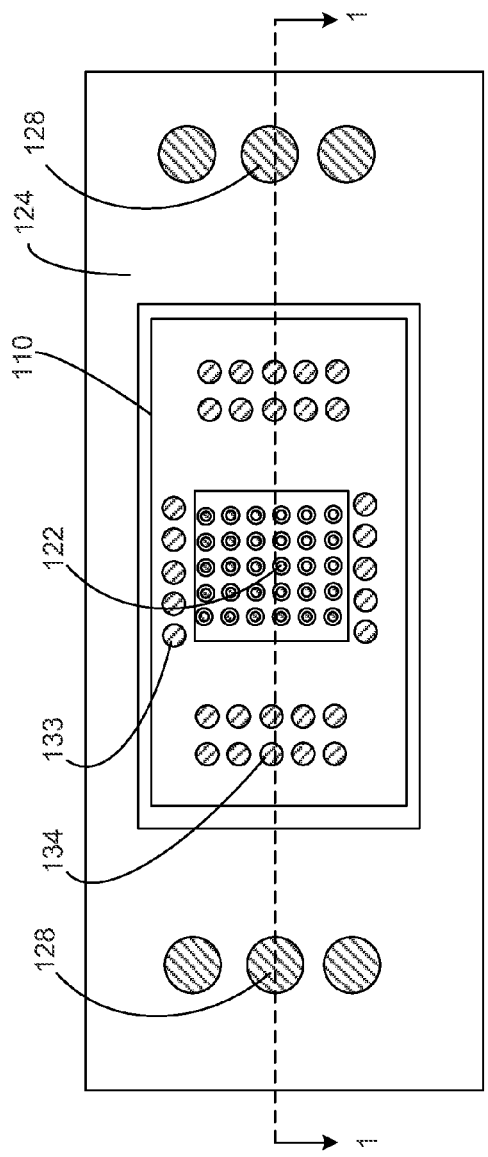

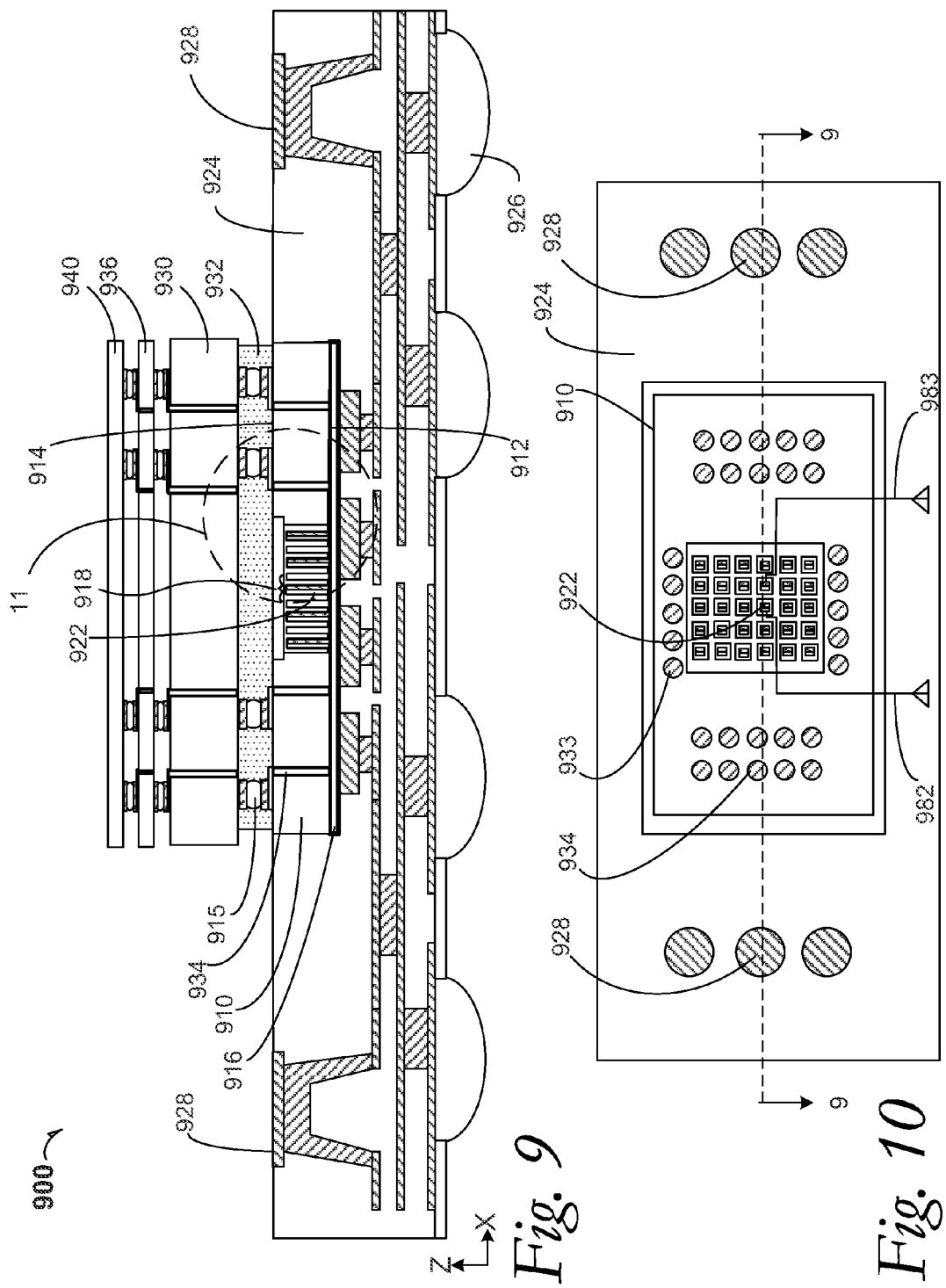

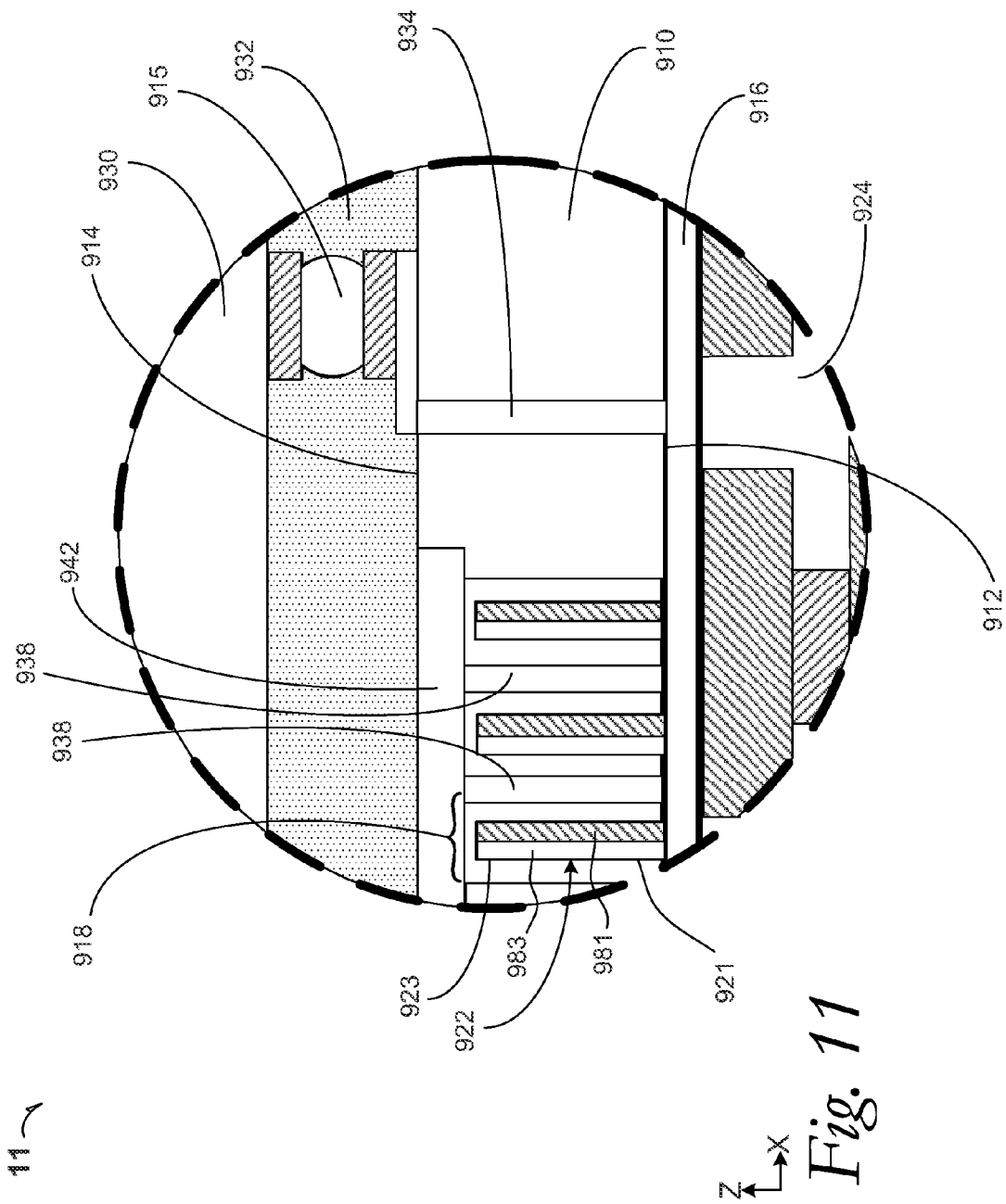

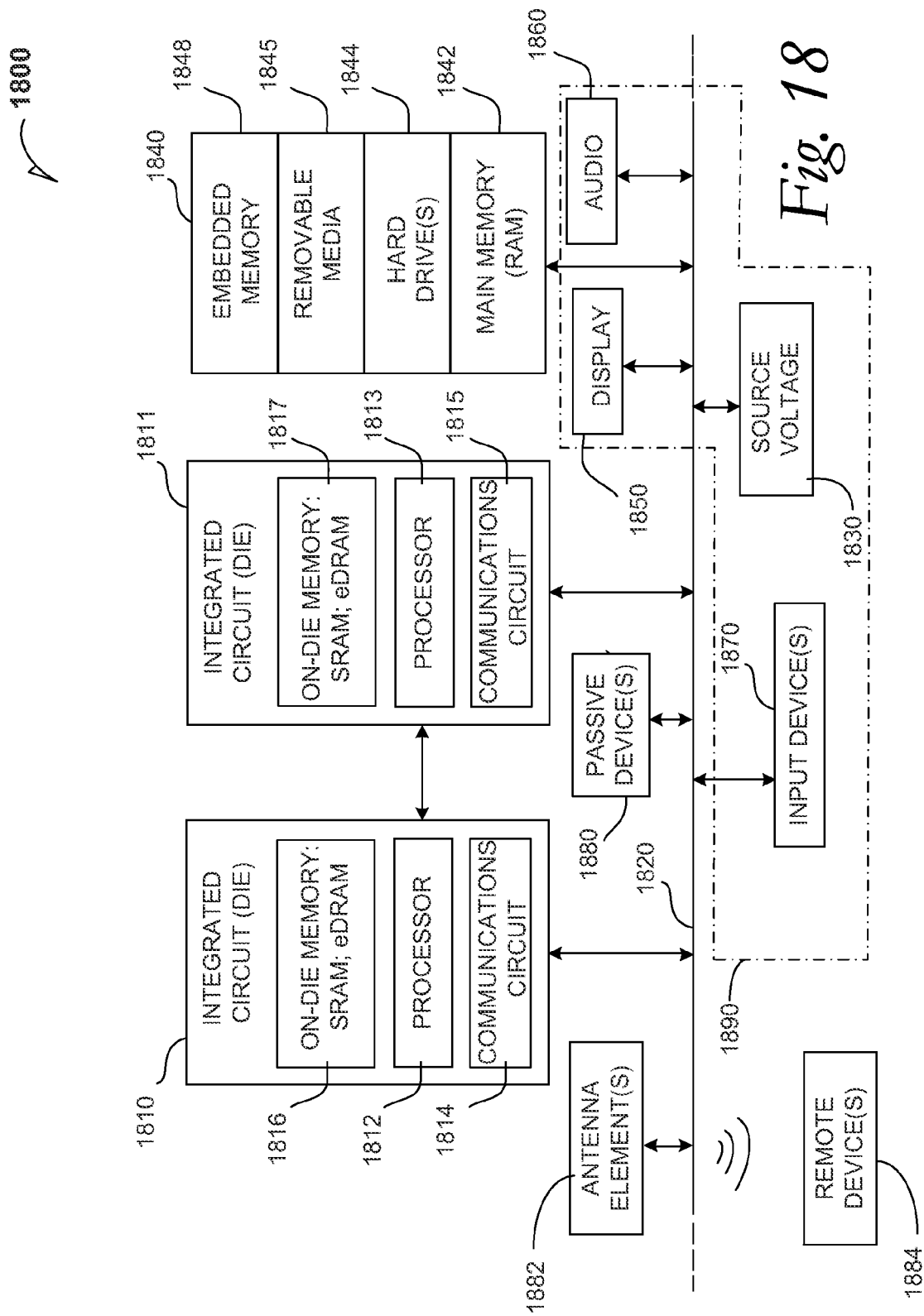

THROUGH-SILICON VIA RESONATORS IN CHIP PACKAGES AND METHODS OF ASSEMBLING SAME

TECHNICAL FIELD

Disclosed embodiments relate to through-silicon via resonators and other micro-electromechanical structures that are assembled in chip packages.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1 is a cross-section elevation of an apparatus that includes an embedded die with a through-silicon via movable member according to an example embodiment;

FIG. 2 is a top plan cut away of the through-silicon via die that includes the through-silicon via movable member depicted in FIG. 1 according to an example embodiment;

FIG. 9 is a cross-section elevation of an apparatus that includes an embedded die with a through-silicon via bimetallic movable member according to an example embodiment;

FIG. 10 is a top plan cut away of the through-silicon via die that includes the through-silicon via bimetallic movable member depicted in FIG. 9 according to an example embodiment;

FIG. 11 is a detail section of the embedded TSV die with the through-silicon via bimetallic movable member depicted in FIG. 9 according to an example embodiment;

FIG. 18 is a schematic of a computer system according to example embodiments.

DETAILED DESCRIPTION

Figure 3:
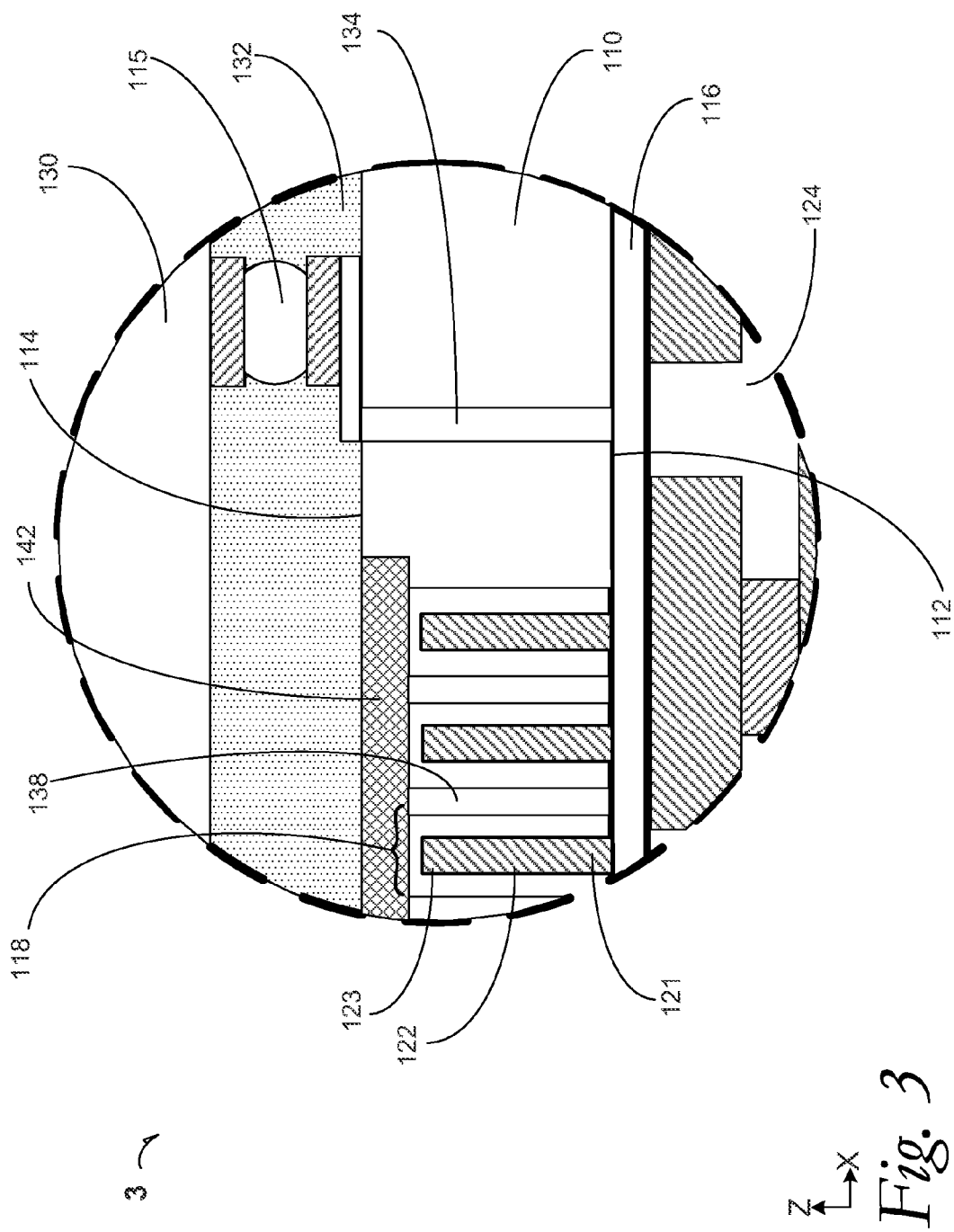
FIG. 3 is a detail section of the embedded die with the through-silicon via movable member depicted in FIG. 1 according to an example embodiment.

Processes are disclosed for fabricating and using movable members contained in TSV dice.

Reference will now be made to the drawings wherein like structures may be provided with like suffix reference designations. In order to show the structures of various embodiments more clearly, the drawings included herein are diagrammatic representations of integrated circuit chips assembled with stacked-die TSV structures. Thus, the actual appearance of the fabricated chip substrates, alone or in chip packages, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

FIG. 1 is a cross-section elevation of an apparatus 100 that includes an embedded die 110 with a through-silicon via 118 movable member 122 according to an example embodiment. Illustrated in FIG. 1 are six movable members, one of which is indicated with the reference numeral 122. It may be understood that the number of movable members may be in a range from one to several hundred according to an embodiment.

The through-silicon via (TSV) microelectronic die 110 is embedded in a coreless, bumpless build-up layer (BBUL-C) substrate 124 according to an example embodiment. The TSV die 110 may be mounted upon a non-BBUL substrate according to an embodiment. The TSV die 110 includes an active surface 112 and a backside surface 114A front-end (FE) metallization 116 is disposed on the active surface 112. It may be understood that semiconductive active devices are disposed at the active surface 112 between the bulk of the TSV die 110 and the FE metallization 116. Although not depicted, such active devices may be devices that comprise logic circuits, input/output circuits, memory circuits, and other devices. Some of these circuits are coupled to each of the FE metallization 116, the movable member 122, and any subsequent die such as through a communication TSV 134.

A TSV 118 (see also FIG. 3) is disposed in the TSV die 110 and the TSV 118 contains a movable member 122 disposed in the TSV 118 that has an affixed first end 121 at a location closer to the active surface 112 than to the backside surface 114, and that has a free end 123 at a location closer to the backside surface 114 than to the active surface 112.

Reference is again made to FIG. 1. In an embodiment, embedding the TSV die 110 includes using the BBUL-C substrate 124 with land-side bumps 126. The BBUL-C substrate 124 is depicted with incidental internal conductive layers and vias along with the land-side bumps 126. In an embodiment, the BBUL-C substrate 124 is a package-on-package (POP) BBUL-C substrate 124. In this embodiment, the BBUL-C substrate 124 has POP bond pads 128 that are provided for electrical communication to a POP package (not pictured).

The TSV die 110 is additionally bumped 115 on the die backside 114 such that a subsequent die 130 may be coupled to the TSV die 110. Assembly of the TSV die 110 to a subsequent die 130 is further accomplished by filling an underfill material 132 between the die backside surface 114 and the subsequent die 130.

It may now be seen that other dice may be similarly assembled as the subsequent die 130. For example, a second die 136 is depicted in compressed, simplified vertical (Z-direction) scale and also simplified form. In an embodiment, the second die 136 is also a TSV die that is mounted upon the subsequent die 130 such that a third die 140 may be stacked upon the second die 136. In an embodiment, the second die 136 is the last die in the stack, is not a TSV die, and it is flip-chip mounted upon the subsequent die 130.

In an embodiment, the TSV die 110 has logic circuitry that uses behavior of the movable member 122 to send a logic word from the TSV die 110 to the subsequent die 130. For example, the TSV die 110 is a system-on-chip (SoC) TSV die 110 that has logic circuitry at the active surface 112. The logic circuitry receives raw data from the movable member 122, which is processed into a logic word. In an embodiment, the TSV die 110 has logic circuitry that uses the movable member 122 to send a logic word from the TSV die 110 to the second die 136. In an example embodiment, the movable member 122 is an oscillator that is motion sensitive and it is used as an accelerometer that sends a logic word to the subsequent die 130 regarding user motion of the entire apparatus 100. In another example embodiment, the movable member 122 is a switch that can open or close such that a logic word may be sent to the subsequent die 130 depending upon switch position. In an embodiment, the movable member 122 is an actuator that is used to reconfigure a capability coupled to the TSV die 110 such as for reconfiguring an antenna for tuning a circuit or antenna switching from, e.g., an 4G use to a Bluetooth® use.

In an embodiment, the TSV die 110 is a logic die and the subsequent die 130 is also a logic die such that electrical coupling therebetween is a logic-to-logic interface (LLI). In an embodiment, the TSV die 110 is a logic die and the subsequent die 130 is a memory die such that electrical coupling therebetween is a logic-to-memory interface (LMI). In an embodiment, the TSV die 110 is a logic die, the subsequent die 130 is also a logic TSV die, and the second die 136 is a memory die. Consequently, an LLI exists between the TSV die 110 and the subsequent die 130, and an LMI exists between the subsequent die 130 and the second die 136. In an embodiment, the third die 140 is a flip-chip memory die such that an MMI exists between the TSV second die 136 and the third die 140.

FIG. 3 is a detail section 3 of the embedded TSV die 110 with the through-silicon via movable member 122 depicted in FIG. 1 according to an example embodiment. In addition to the TSV 118 that houses the movable member 122, a power/ground/signal TSV 134 communicates between the active surface 114 and the subsequent die 130 though routing that includes the electrical bump 115.

Other communications are used between the TSV die 110 and the subsequent die 130. As illustrated, the power/ground/signal TSV 134 is disposed between the FE metallization 116 and the subsequent die 130. The location of the TSV 118 also exhibits an interstitial wall 138 between two adjacent movable members.

A protective film 142 such as a silicon nitride layer 142 is formed upon the TSV die 110 and bridges across the interstitial walls 138. The protective film 142 is used to seal the movable members 122 while allowing the free end 123 to move within a protected space.

FIG. 2 is a top plan cut away of the through-silicon via die 110 that includes the through-silicon via movable member 122 depicted in FIG. 1 according to an example embodiment. The cross-section view depicted in FIG. 1 may be approximated at the section line 1-1. The TSV die 110 exhibits the movable member 122 as well as the power/ground/signal TSV 134. The BBUL-C substrate 124 is shown with the TSV die 110 embedded. Other TSVs 133 are shown, which may be signal or power/ground TSVs. In an embodiment, the TSV is an actuator that opens and closes based upon driving forces such that wiring may be reconfigured for a give use on the BBUL-C.

Figure 4:
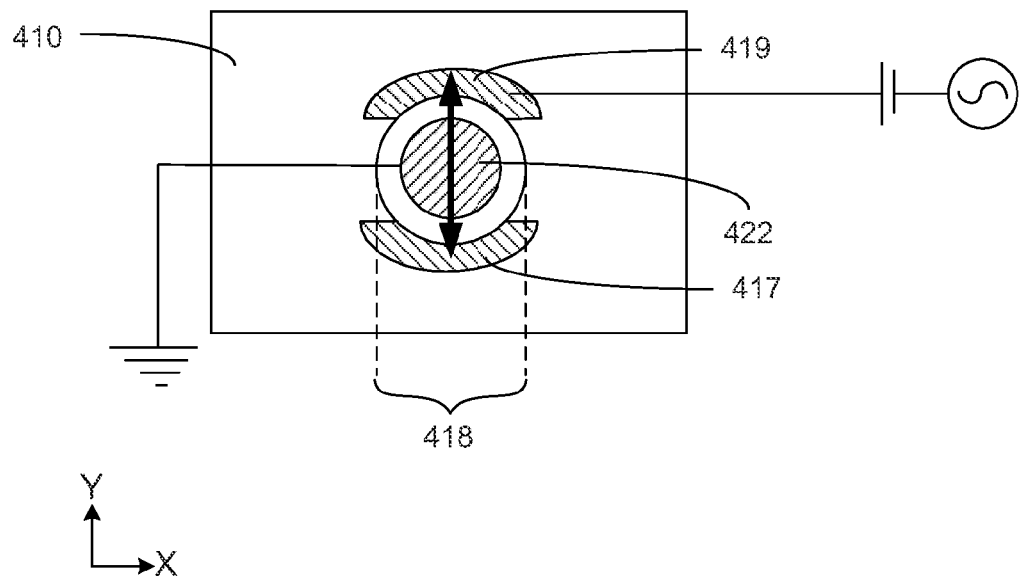
FIG. 4 is a top plan schematic of a movable member in a TSV of a TSV die according to an example embodiment.

FIG. 4 is a top plan schematic of a movable member 422 in a TSV 418 of a TSV die 410 according to an example embodiment. A TSV 418 houses a movable member 422 and electrodes 417 and 419 are located in the periphery of the TSV 418. In an embodiment, the electrodes 417 and 419 are used to drive the movable member 422 such as with electromagnetic forces and at least one power source as well as a ground. In an embodiment, motion of the movable member 422 is detected at the electrodes 417 and 419. The electrodes 417 and 419 may be made from the same material as the movable member 422 during processing according to an embodiment. Motion of the movable member 422 is indicated in the Y direction by the two-headed arrow that is superimposed over the movable member 422. Motion of the movable member represents exchanging electromagnetic information between the free end of the movable member and either of the electrodes 417 and 419.

Figure 5:
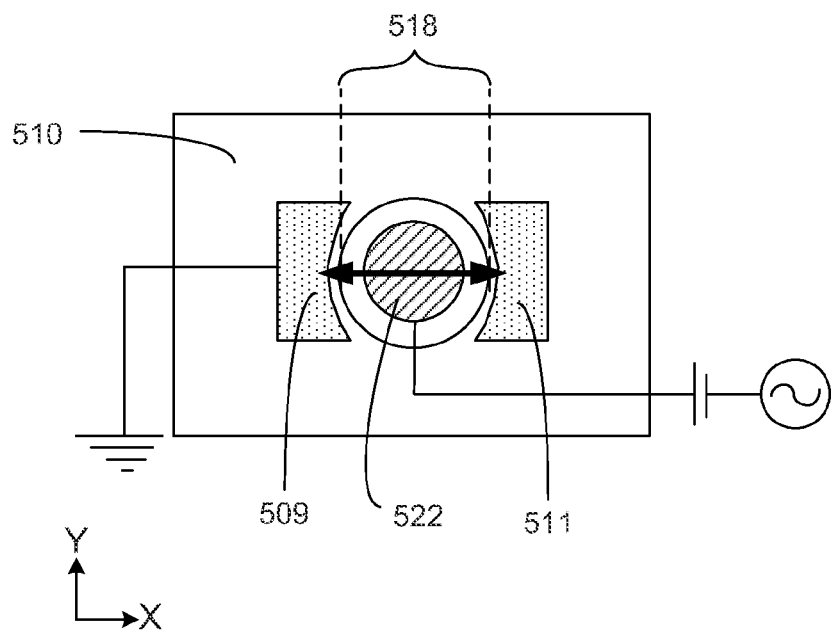
FIG. 5 is a top plan schematic of a movable member in a TSV of a TSV die according to an example embodiment.

FIG. 5 is a top plan schematic of a movable member 522 in a TSV 518 of a TSV die 510 according to an example embodiment. A TSV 518 houses a movable member 522 and electrodes 509 and 511 are located in the periphery of the TSV 518. In an embodiment, the electrodes 509 and 511 are used to drive the movable member 522 such as with electromagnetic forces and at least one power source as well as a ground. In an embodiment, motion of the movable member 522 is detected at the electrodes 509 and 511. The electrodes 509 and 511 may be processed semiconductive material such as doped portions of the TSV die 510 during processing according to an embodiment. Motion of the movable member 422 is indicated in the X direction by the two-headed arrow that is superimposed over the movable member 422.

Figures 6A, 6B:
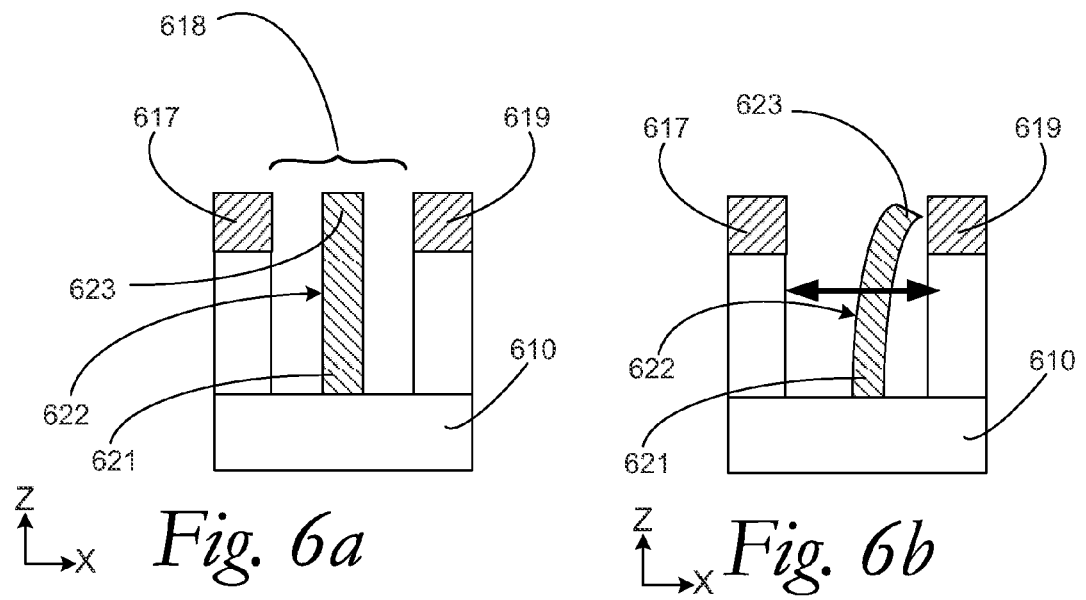
FIGS. 6a and 6b are cross-section elevations of a through-silicon via movable member that may be either of the structures depicted in FIG. 4 or 5 according to an example embodiment.

FIGS. 6a and 6b are cross-section elevations of a through-silicon via movable member that may be either of the structures depicted in FIG. 4 or 5 according to an example embodiment. A semiconductive substrate 610 has been processed to form a TSV 618 and in which a movable member 622 has been formed. Electrodes 617 and 619, disposed in the periphery of the TSV 618, are represented schematically as either metallic deposited electrodes such as the electrodes 417 and 419 depicted in FIG. 4, or as semiconductive electrodes formed in the semiconductive substrate such as the electrodes 509 and 511 depicted in FIG. 5.

At FIG. 6b, motion of the movable member 622 is seen where the affixed first end 621 is stationary but the free end 623 is oscillating between the electrodes 617 and 619. As an oscillator, the free end 623 may be observed to be at maximum amplitude motion such as alternating contact thereof with the first electrode 617 and the second electrode 619. In an embodiment, the electrodes 617 and 619 are motion detectors such as for an accelerometer. In an embodiment, the electrodes 617 and 619 are detectors such as circuit-closing contacts. In an embodiment, the free end 623 has moved like a closing switch to close a circuit by approaching to touch at the electrode 619.

It may now be appreciated that an accelerometer structure may have movable members that must move in the Y-Z plane in concert with movable members that must move in the X-Z plane in order to provide useful motion data to send from, e.g., the TSV die 110 to the subsequent die 130 as seen in FIG. 1.

Figures 7A, 7B:
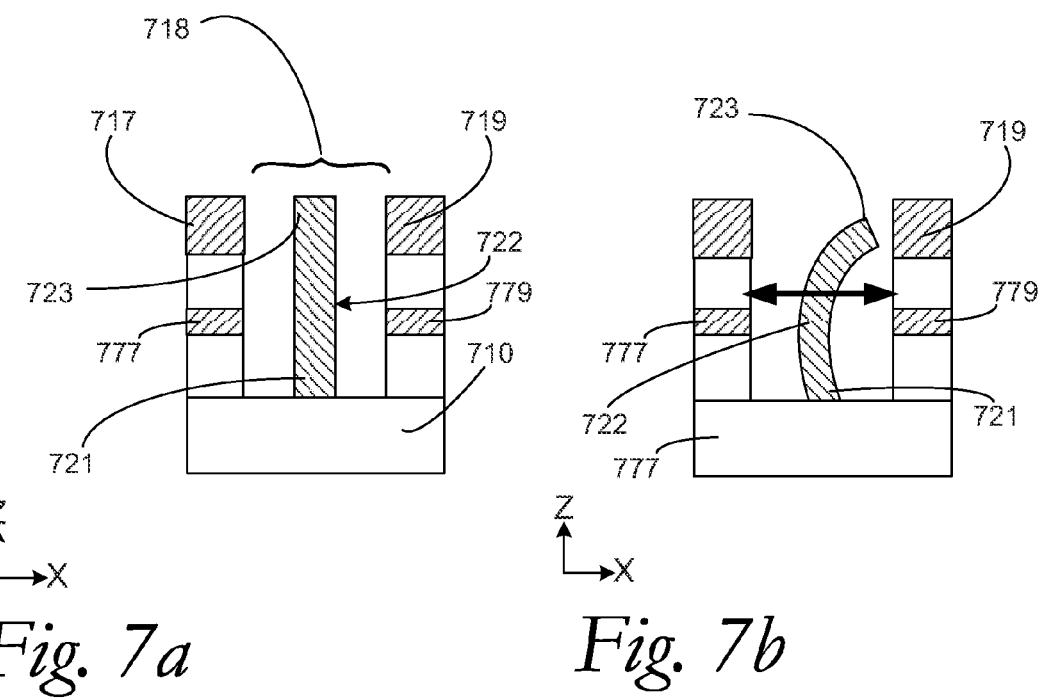
FIGS. 7a and 7b are cross-section elevations of a through-silicon via movable member that may be either of the structures depicted in FIG. 4 or 5 according to an example embodiment.

FIGS. 7a and 7b are cross-section elevations of a through-silicon via movable member that may be either of the structures depicted in FIG. 4 or 5 according to an example embodiment. A semiconductive substrate 710 has been processed to form a TSV 718 and in which a movable member 722 has been formed. Electrodes 717 and 719, disposed in the periphery of the TSV 718, are represented schematically as either metallic deposited electrodes such as the electrodes 417 and 419 depicted in FIG. 4, or as semiconductive electrodes formed in the semiconductive substrate such as the electrodes 509 and 511 depicted in FIG. 5. Additionally, electrode complexity is increased by the presence of supplemental electrodes 777 and 779, which are represented schematically disposed within the TSV 718, also within the periphery, but below the primary electrodes 717 and 719. It can be seen that the first semiconductive electrode 717 is closer to the first end 723 than the supplemental electrode 777.

At FIG. 7b, motion of the movable member 722 is seen where the fixed end 721 is stationary, the free end 723 is deflecting toward the primary electrode 719, but maximum amplitude of oscillation is in the middle of the movable member approximately where the lead line 722 is touching. In an embodiment, the primary electrodes 717 and 719 act to urge the free end 723 into a substantial motionless configuration while the supplemental electrodes 777 and 779 urge the center of the movable member 722 to maximum amplitude. Consequently, deflection of the free end 723 is minimized similar to that of the fixed end 721. In an embodiment as an oscillator, the free end 723 may also achieve a maximum amplitude motion and a center portion of the movable member may also achieve a maximum amplitude motion such that a node may exist between the free end 723 and the fixed end 721. Alternatively, the free end 723 has moved like a closing switch to close a circuit by approaching to touch at the electrode 719. Switch closing may be assisted by use of the supplemental electrodes 777 and 779. Consequently, resonance behavior of the moving member is changeable by such biasing. Further detection sensitivity can be changed when the moving member 722 is an oscillator. In an embodiment, biasing is used to change behavior of the moving member 722 when it is used as a switch.

It will now be understood that where n electrodes are present (in FIG. 7a, four electrodes 717, 719, 777, and 779 are present), up to n−1 electrodes may be used for biasing with only one electrode used to move the movable member 722. Similarly and conversely, up to n−1 electrodes may be used to move the movable member 722 with only one electrode used to bias it. Consequently, a plurality of electrodes may include more than the four illustrated such as six where four of the electrodes are positioned within the TSV 718, also within the periphery, but below the primary electrodes 717 and 719. Also, electrode size may be different according to an embodiment such as the primary electrodes 717 and 179 are larger in surface area that faces the movable member 722 than at least one of the supplemental electrodes.

It may now be observed that complex oscillators and switches may be fabricated from the movable member embodiments where movable-member aspect ratio is combined with electrode strength to achieve useful oscillator embodiments.

FIGS. 8a through 8k are cross-section elevations of a through-silicon via movable member during processing according to example embodiments. A semiconductive substrate precursor 109 is presented with an FE metallization 116. The semiconductive substrate precursor 109 may be referred to as a full-thickness wafer 109, which may mean an array of TSV dice is being processed at wafer-level processing.

Figure 8A:
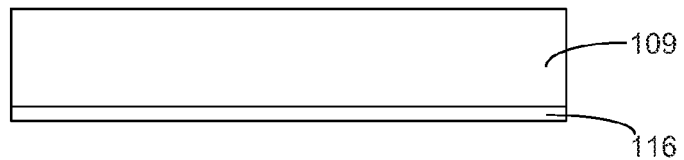
FIGS. 8a through 8h and 8k are cross-section elevations of a through-silicon via movable member during processing according to example embodiments.
Figure 8B:
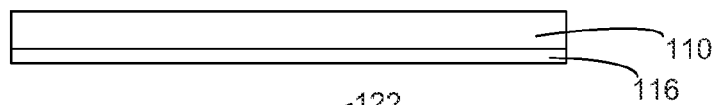

At FIG. 8b, thinning of the semiconductive substrate precursor 109, seen in FIG. 8a, has resulted in a thinned semiconductive substrate 110. Processing may include using a handle wafer as a carrier and adhesive bonding that is removed after appropriate thinning and other processing.

Figure 8C:
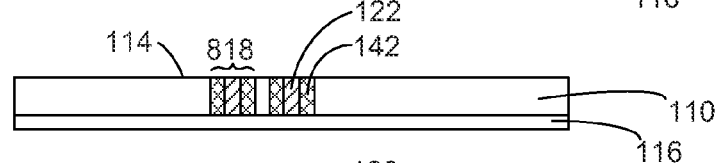

At FIG. 8c, processing has resulted in a sacrificial fill material 142 that has been filled into patterned TSVs, followed by plating the movable members 122 in place. In an embodiment, the sacrificial fill material 142 is a titanium liner and the movable member is a copper material. Formation of the sacrificial fill material 142 may include physical vapor deposition (PVD) such as titanium sputtering of a seed layer, followed by electroplating onto the seed layer to achieve the sacrificial fill material 142. Formation of the movable member 122 may include sputtering a copper seed layer onto the sacrificial fill material 142, followed by copper electroplating. A conventional TSV material may differ from movable member embodiments as disclosed movable member embodiments are useful as TSV-based resonator embodiments as well as TSV-based switch embodiments as non-limiting examples.

Prior to further processing, formation of semiconductive electrodes in the periphery of the TSV 818 may be carried out such as by ion doping into the die backside 114.

In a resonator embodiment, the materials, lengths, widths, and heights of the movable member 122 may be selected for useful natural resonator frequencies such as for a radio-frequency transmitter. Dimensions, including aspect ratios of the movable members 122, are selected along with materials and spacings between the movable members and the electrodes, as well as electrode complexities in order to achieve useful resonator/switch/sensor embodiments. Additionally, formation of the movable members may be integrated into formation of the power/ground/signal TSV 134 in order to reduce processes upon the TSV die 110.

Figure 8D:
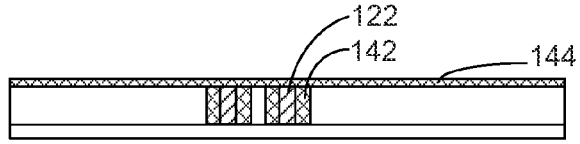

At FIG. 8d, a sacrificial plate 144 has been formed over the sacrificial fill material 142 as well as over the movable members 122.

Figure 8E:
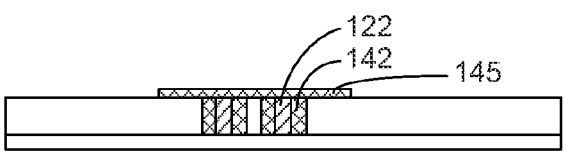

At FIG. 8e, patterning of the sacrificial plate 144 has resulted in a patterned sacrificial plate 145 that remains over the sacrificial fill material 142 as well as the movable members 122. The patterned sacrificial plate 145 will form a release cavity during subsequent processing in order to release the movable members 122.

Figure 8F:
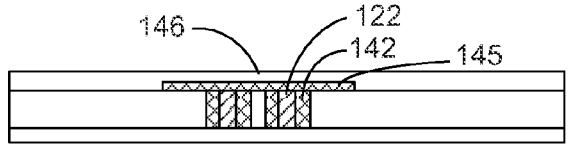

At FIG. 8f, processing has resulted in a release-lattice precursor 146 such as a titanium nitride material that will have a different etch-selectivity response to that of the semiconductive substrate 110 and likewise a different etch-selectivity response to that of the sacrificial materials.

Figure 8G:
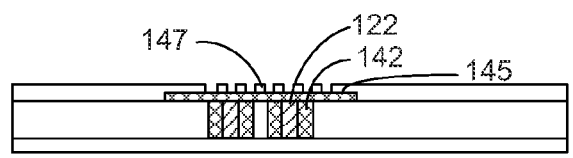

At FIG. 8g, processing has resulted in a patterned release-lattice layer 147 such that the patterned sacrificial plate 145 is exposable to a release process. A release process includes a plasma/dry etch removal of the sacrificial materials. In an embodiment, a release process includes a thermal release of the sacrificial materials. In an embodiment, a release process includes a wet etch of the sacrificial materials. In an embodiment, a release process includes a vapor etch of the sacrificial materials.

Figure 8H:
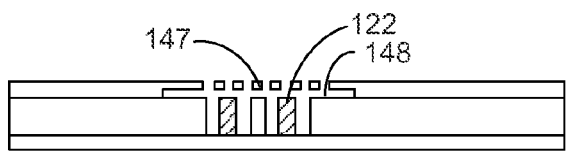

At FIG. 8h, processing has resulted in a cavity 148 that has released the movable members 122. In an embodiment, a release process includes thermal processing such that the patterned sacrificial plate 145 and the sacrificial fill material are susceptible to removal by making them fugitive and allowing fugitive byproducts to vaporize and pass through the patterned release lattice layer 147.

In an embodiment, a release process includes wet chemical processing such that the patterned sacrificial plate 145 and the sacrificial fill material are susceptible to removal by wet-chemical dissolution that allows fugitive byproducts to dissolve and pass through the patterned release-lattice layer 147.

Figure 8K:
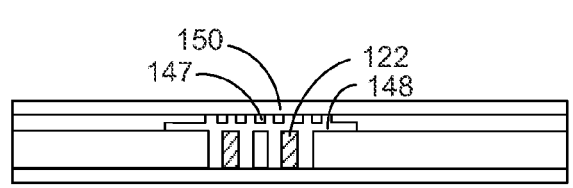

At FIG. 8k, processing has resulted in cavity sealing of the movable members 122 by forming a sealing layer 150 over the patterned release-lattice layer 147. In an embodiment, the sealing layer 150 is a silicon nitride material that is deposited under conditions to bridge gaps in the patterned release-lattice layer 147, but not to fill the cavity 148. In a process embodiment, isotropic chemical vapor deposition (CVD) of a silicon nitride material is carried out to form the sealing layer 150.

It may now be appreciated that the release process may be done in a release-first mode such that the movable members are motion capable before the TSV die is embedded into a substrate such as before the TSV die 110 is embedded into the BBUL-C 124 substrate. In an embodiment, the release process may be done in a release-last mode such that the movable members are motion capable only after the TSV die has been embedded into a substrate such as after the TSV die 110 has been embedded into the BBUL-C 124 substrate.

FIG. 9 is a cross-section elevation of an apparatus 900 that includes an embedded die 910 with a through-silicon via 918 bimetallic movable member 922 according to an example embodiment. Illustrated in FIG. 9 are six bimetallic movable members, one of which is indicated with the reference numeral 922. It may be understood that the number of bimetallic movable members may be in a range from one to several hundred according to an embodiment.

The TSV microelectronic die 910 is embedded in a coreless, bumpless build-up layer (BBUL-C) substrate 924 according to an example embodiment. The TSV die 910 may be mounted upon a non BBUL-C substrate according to an embodiment. The TSV die 910 includes an active surface 912 and a backside surface 914. An FE metallization 916 is disposed on the active surface 912.

A TSV 918 (see also FIG. 11) is disposed in the TSV die 910 and the TSV 918 contains a bimetallic movable member 922 disposed in the TSV 918 that has a fixed first end 921 at a location closer to the active surface 912 than to the backside surface 914, and that has a free end 923 at a location closer to the backside surface 914 than to the active surface.

Reference is again made to FIG. 9. Embedding the TSV die 910 includes using the BBUL-C substrate 924 with land-side bumps 926. The BBUL-C substrate 924 is depicted with incidental internal conductive layers and vias along with the land-side bumps 926. In an embodiment, the BBUL-C substrate 924 is a POP BBUL-C substrate 924. In this embodiment, the POP BBUL-C substrate 924 has POP bond pads 928 that are provided for electrical communication to a POP package (not pictured).

The TSV die 910 is additionally bumped 915 on the die backside 914 such that a subsequent die 930 may be coupled to the TSV die 910. Assembly of the TSV die 910 to the subsequent die 930 is further accomplished by filling an underfill material 932 between the die backside surface 914 and the subsequent die 930.

It may now be seen that other dice may be similarly assembled as the subsequent die 930. For example, a second die 936 is depicted in compressed, simplified vertical (Z-direction) scale and also simplified form. In an embodiment, the second die 936 is also a TSV die that is mounted upon the subsequent die 930 such that a third die 940 may be stacked upon the second die 936. In an embodiment, the second die 936 is the last die in the stack, is not a TSV die, and it is flip-chip mounted upon the subsequent die 930.

In an embodiment, the TSV die 910 has logic circuitry that uses the bimetallic movable member 922 to send a logic word from the TSV die 910 to the subsequent die 930. In an embodiment, the TSV die 910 has logic circuitry that uses the bimetallic movable member 922 to send a logic word from the TSV die 910 to the second die 936. For example, the bimetallic movable member 922 is an oscillator that is motion sensitive and it is used as an accelerometer that sends a logic word to the subsequent die 930 regarding user motion of the entire apparatus. In another example embodiment, the bimetallic movable member 922 is a switch that can open or close such that a logic word may be sent to the subsequent die 930 depending upon switch position.

In an embodiment, the TSV die 910 is a logic die and the subsequent die 930 is also a logic die such that electrical coupling therebetween is an W. In an embodiment, the TSV die 910 is a logic die and the subsequent die 930 is a memory die such that electrical coupling therebetween is an LMI. In an embodiment, the TSV die 910 is a logic die, the subsequent die 930 is also a logic TSV die, and the second die 936 is a memory die. Consequently, an LLI exists between the TSV die 910 and the subsequent die 930, and an LMI exists between the subsequent die 930 and the second die 936. In an embodiment, the third die 940 is a flip-chip memory die such that an MMI exists between the TSV second die 936 and the third die 940.

FIG. 11 is a detail section 11 of the embedded TSV die 910 with the through-silicon via bimetallic movable member 922 depicted in FIG. 9 according to an example embodiment. The bimetallic movable member 922 includes a first component 981 and a second component 923 such that the two components are different metals.

In addition to the TSV 918 that houses the bimetallic movable member 922, a power/ground/signal TSV 934 communicates between the active surface 914 and the subsequent die 930 though routing that includes the electrical bump 915.

Other communications are used between the TSV die 910 and the subsequent die 930. As illustrated, the power/ground/signal TSV 934 is disposed between the FE metallization 9116 and the subsequent die 930. The location of the TSV 918 also exhibits an interstitial wall 938 between two adjacent movable members.

A protective film 942 such as a silicon nitride layer 942 is formed upon the TSV die 910 and it is depicted bridging across the interstitial walls 938. The protective film 942 is used to seal the bimetallic movable members 922 while allowing the free end to move within a protected space.

FIG. 10 is a top plan cut away of the through-silicon via die 910 that includes the through-silicon via bimetallic movable member 922 depicted in FIG. 9 according to an example embodiment. The cross-section view depicted in FIG. 9 may be approximated at the section line 9-9. The TSV die 910 exhibits the bimetallic movable member 922 as well as the power/ground/signal TSV 934. The BBUL-C substrate 924 is shown with the TSV die 910 embedded. Other TSVs 933 are shown, which may be signal or power/ground TSVs.

In a method embodiment, the bimetallic movable member 922 closes a circuit to engage a first antenna element 982 such as a frequency modulation (FM) antenna element 982. In a method embodiment, the bimetallic movable member 922 closes a circuit to engage a first antenna element 982 that is a WiFi antenna element. In a method embodiment, the bimetallic movable member 922 closes a circuit to engage a first antenna element 982 such as a frequency modulation (FM) antenna element 982. In a method embodiment, the bimetallic movable member 922 closes a circuit to engage a first antenna element 982 that is a WiFi antenna element. In a method embodiment, the bimetallic movable member 922 closes a first circuit to engage a first antenna element 982 and a second circuit to engage a second antenna element 984 in order to tune a communications circuit in a way that the first- and second-antenna elements 982 and 984, respectively, better enable the communications circuit to operate than with one antenna element alone.

Figure 12:
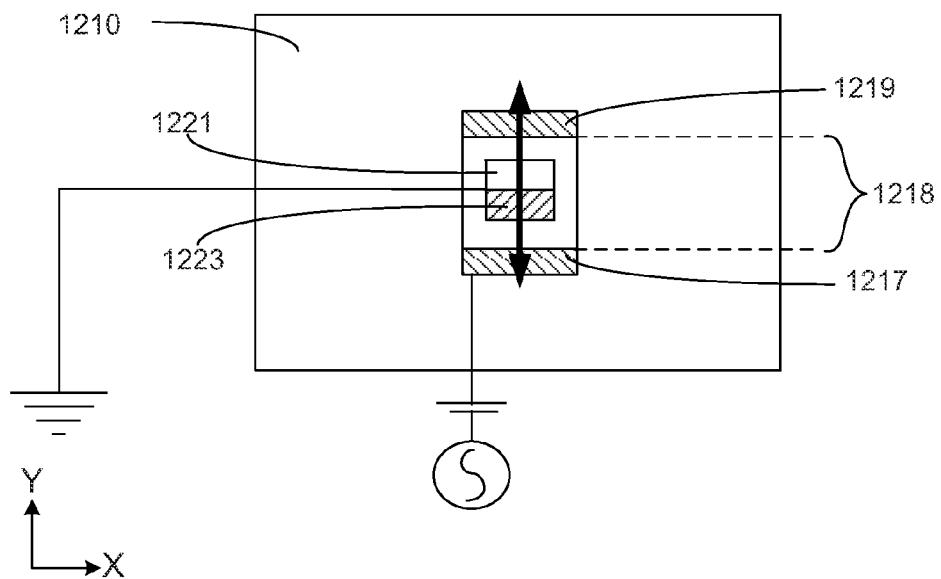
FIG. 12 is a schematic of a through-silicon via bimetallic movable member that is coupled to either a power source or a detector according to an example embodiment.

FIG. 12 is a top plan schematic of a movable member 1222 in a TSV 1218 of a TSV die 1210 according to an example embodiment. A TSV 1218 houses a bimetallic movable member that is made up of a first component 1221 and a second component 1223 and electrodes 1217 and 1219 are located on the periphery of the TSV 1218. In an embodiment, the electrodes 1217 and 1219 are used to drive the bimetallic movable member such as with electromagnetic forces and at least one power source as well as a ground. In an embodiment, motion of the bimetallic movable member is detected at the electrodes 1217 and 1219. The electrodes 1217 and 1219 may be made from the same material as one component of the bimetallic movable member during processing according to an embodiment. Motion of the bimetallic movable member is indicated in the Y direction by the two-headed arrow that is superimposed over the bimetallic movable member.

Figure 13:
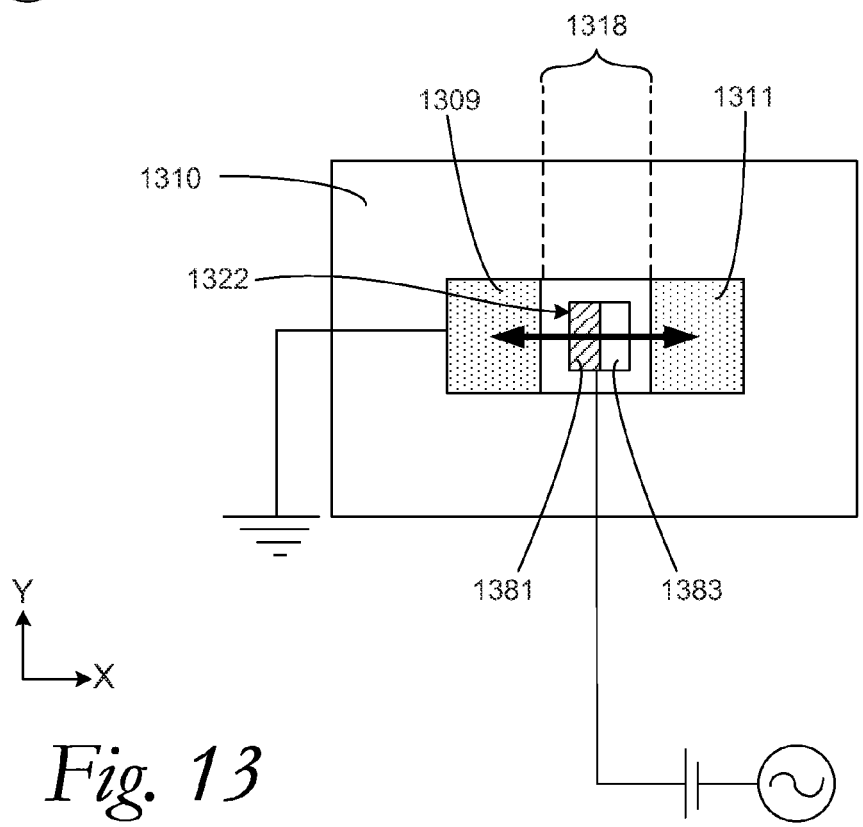
FIG. 13 is a top plan schematic of a bimetallic movable member that is made up of a first component and a second component in a TSV of a TSV die according to an example embodiment.

FIG. 13 is a top plan schematic of a bimetallic movable member that is made up of a first component 1381 and a second component 1383 in a TSV 1318 of a TSV die 1310 according to an example embodiment. A TSV 1318 houses a bimetallic movable member 1322 and electrodes 11309 and 13111 are located in the periphery of the TSV 1318. In an embodiment, the electrodes 1309 and 1311 are used to drive the bimetallic movable member such as with electromagnetic forces and at least one power source as well as a ground. In an embodiment, motion of the bimetallic movable member is detected at the electrodes 1309 and 1311. The electrodes 1309 and 1311 may be processed semiconductive material such as doped portions of the TSV die 1310 during processing according to an embodiment. Motion of the bimetallic movable member is indicated in the X direction by the two-headed arrow that is superimposed over the bimetallic movable member.

Figures 14A, 14B:
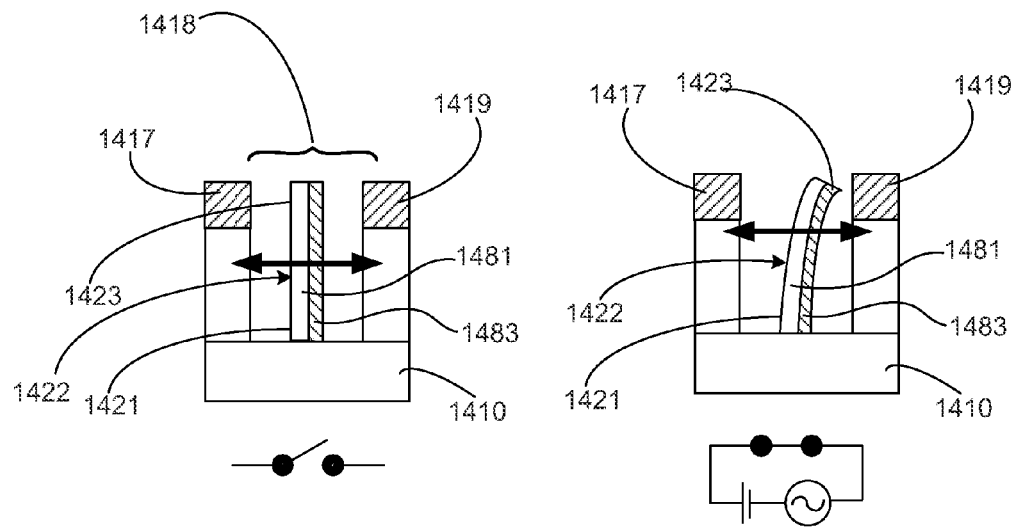
FIGS. 14a and 14b are cross-section elevations of a through-silicon via bimetallic movable member that may be either of the structures depicted in FIG. 12 or 13 according to an example embodiment.

FIGS. 14a and 14b are cross-section elevations of a through-silicon via bimetallic movable member that may be either of the structures depicted in FIG. 12 or 13 according to an example embodiment. A semiconductive substrate 1410 has been processed to form a TSV 1418 and in which a movable member 1422 has been formed. Electrodes 1417 and 1419 are represented schematically as either metallic deposited electrodes such as the electrodes 12117 and 1219 depicted in FIG. 12, or as semiconductive electrodes formed in the semiconductive substrate such as the electrodes 1309 and 1311 depicted in FIG. 13.

At FIG. 14b, motion of the movable member 1422 is seen where the fixed first end 1421 is stationary but the free end 1423 is oscillating between the electrodes 1417 and 1419. As an oscillator, the free end 1423 may be observed to be at maximum amplitude motion. In an embodiment, the electrodes 1417 and 1419 are motion detectors such as for an accelerometer. In an embodiment, the electrodes 1417 and 1419 are detectors such as circuit-closing contacts. In an embodiment, the free end has moved like a closing switch because of heat-expansion differences between the first component 1481 and the second component 1483 such that the second component 1483 expands less under the heating load. Consequently, a circuit is closed by the bimetallic movable member 1422 approaching to touch at the electrode 1419.

Figures 15A, 15B:
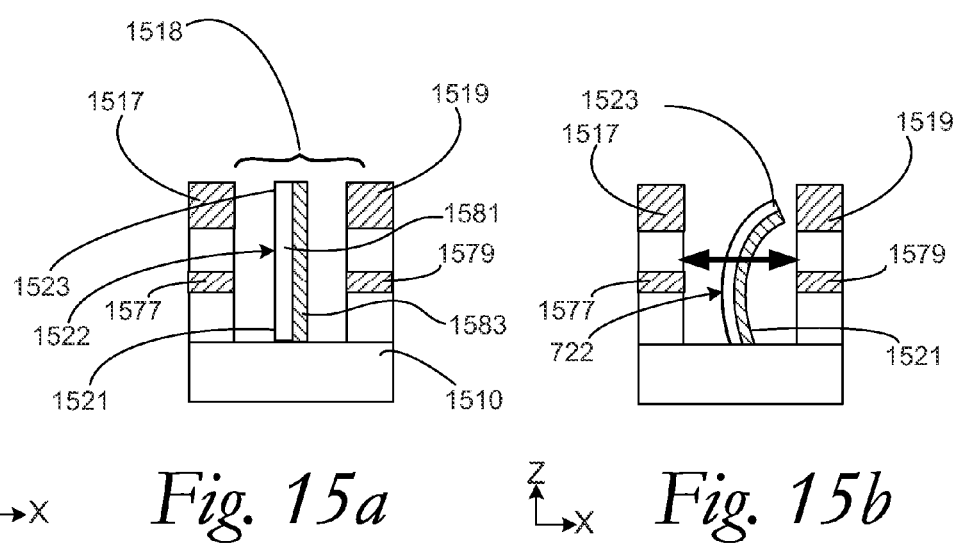
FIGS. 15a and 15b are cross-section elevations of a through-silicon via movable member that may be either of the structures depicted in FIG. 12 or 13 according to an example embodiment.

FIGS. 15a and 15b are cross-section elevations of a through-silicon via movable member that may be either of the structures depicted in FIG. 12 or 13 according to an example embodiment. A semiconductive substrate 1510 has been processed to form a TSV 1518 and in which a movable member 1522 has been formed. Electrodes 1517 and 1519 are represented schematically as either metallic deposited electrodes such as the electrodes 1217 and 1219 depicted in FIG. 12, or as semiconductive electrodes formed in the semiconductive substrate such as the electrodes 1317 and 13119 depicted in FIG. 13. Additionally, electrode complexity is increased by the presence of supplemental electrodes 1577 and 1579, which are represented schematically disposed within the TSV 1518 but below the primary electrodes 1517 and 1510.

At FIG. 15b, motion of the movable member 1522 is seen where the fixed first end 1521 is stationary, the free end 1523 is deflecting toward the primary electrode 1519, but maximum amplitude of oscillation is in the middle of the movable member approximately where the lead line 1522 is touching. In an embodiment, the primary electrodes 1517 and 1549 act to urge the free end 1523 into a substantial motionless configuration while the supplemental electrodes 1577 and 1579 urge the center of the movable member 1522 to maximum amplitude. Consequently, deflection of the free end 1523 is minimized similar to that of the fixed end 1521. In an embodiment as an oscillator, the free end 1523 may also achieve a maximum amplitude motion and a center portion of the movable member may also achieve a maximum amplitude motion such that a node may exist between the free end 1523 and the fixed end 1521. Alternatively, the free end 1523 has moved like a closing switch to close a circuit by approaching to touch at the electrode 1519 because of heat-expansion differences between the first component 1581 and the second component 1583 such that the second component 1583 expands less under the heating load. Consequently, a circuit is closed by the bimetallic movable member 1522 approaching to touch at the electrode 1519. Switch closing may be assisted by use of the supplemental electrodes 1577 and 1579.

It may now be appreciated that use of the bimetallic movable member may include real-time re-tuning of an oscillator such as the bimetallic movable member 1422 seen in FIG. 14. For example, oscillatory properties may change due to changed temperatures, but the bimetallic oscillator 1422 may be re-tuned depending upon temperature. Further, a combination of oscillators such as the movable member 622 or the movable member 722, may be combined with data received from open- or closed switch bimetallic movable members such as the bimetallic movable member 1422. Consequently, tuning of a movable member may be altered depending upon known or measured temperature states of the semiconductive substrate.

It may now be observed that complex oscillators and switches may be fabricated from the movable member embodiments where movable-member aspect ratio is combined with electrode strength to achieve useful oscillator embodiments.

FIGS. 8a and 16b through 16m are cross-section elevations of a through-silicon via movable member during processing according to example embodiments. A semiconductive substrate precursor 109 (FIG. 8a) is presented with an FE metallization 116. The semiconductive substrate precursor 109 may be referred to as a full-thickness wafer 109, which may mean an array TSV dice is being processed at wafer-level processing.

Figure 16B:
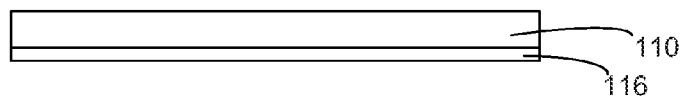
FIGS. 16b through 16h, 16k and 16m are cross-section elevations of a through-silicon via bimetallic movable member during processing according to example embodiments.

At FIG. 16b, thinning of the semiconductive substrate precursor 109, seen in FIG. 8a, has resulted in a thinned semiconductive substrate 110. Processing may include using a handle wafer as a carrier and adhesive bonding that is removed after appropriate thinning and other processing.

Figure 16C:
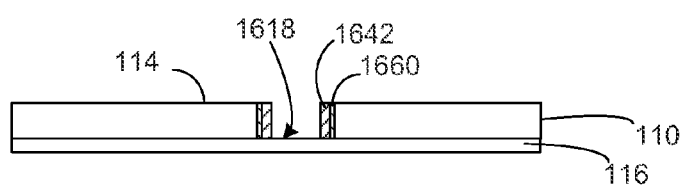

At FIG. 16c, processing has resulted in an open TSV 1618 has been achieved with a TSV etch. Process conditions may be conventional to open the TSV. Further processing includes a sputtered seed layer 1660 such as a titanium material on the sidewalls of the TSV 1618. Additionally, a sacrificial fill material 1642 has been filled into the TSV 1618 such as by directional PVD, followed by isotropic sputter removal etching such that the backside and the BE metallization 116 are cleared of the sacrificial fill material. Prior to further processing, formation of semiconductive electrodes in the periphery of the TSV 1618 may be carried out such as by ion doping into the die backside 114.

Figure 16D:
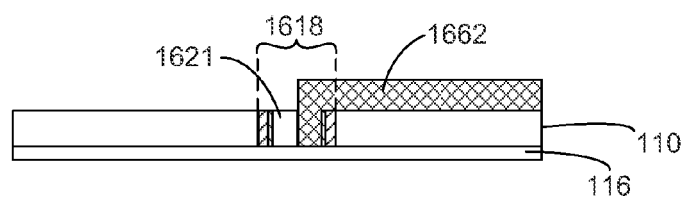

At FIG. 16d, processing exhibits a TSV split mask 1662 that half-fills the TSV 1618. In an embodiment, a resist or a hard mask is patterned to partially-fill the TSV 1618. To the degree of filling the TSV, the two components need not be volumetrically equal. For example, a larger component may be first plated, followed by a smaller second component. As depicted, a first bimetallic movable member component 1681 has been plated into the TSV 1618 portion that is open. In an embodiment, the sacrificial fill material 11642 is a titanium liner and the bimetallic movable member first component 1681 is a copper material. Processing of the bimetallic movable member first component 1681 may be accomplished by plating copper.

Figure 16E:
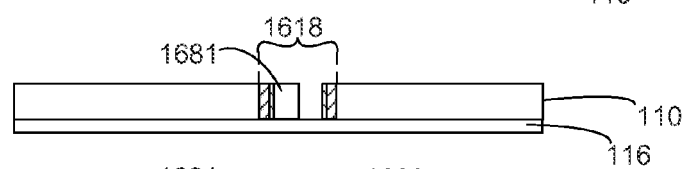

At FIG. 16e, processing exhibits removal of the TSV split mask 1662 to reveal a partially TSV 1618. Removal of the TSV split mask 1662 may be done by any useful process such as strip-rinsing or ashing. The bimetallic movable member first component 1681 is depicted within the TSV 1618.

Figure 16F:
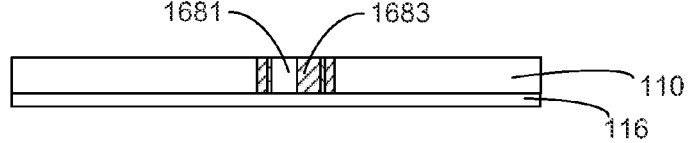

At FIG. 16f, processing exhibits filling of the bimetallic movable member second component 1683 such as a tungsten material that is electroplated upon the sacrificial fill material 1660. In an embodiment, the movable member first component 1681 is partially oxidized to grow the movable member second component 1683 as an oxide. Other processing may be done such as growing an oxynitride to form the movable member second component 1683.

Figure 16G:
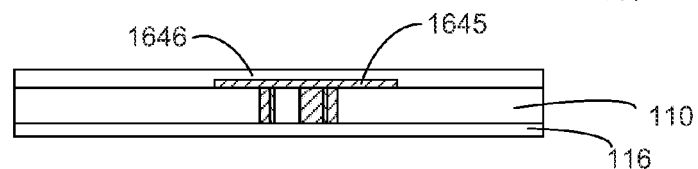

At FIG. 16g, processing has been done to achieve a patterned sacrificial plate 1645 that remains over the sacrificial fill material 1642 as well as the bimetallic movable member first- and second components 1681 and 1683, respectively. The patterned sacrificial plate 1645 will form a release cavity during subsequent processing in order to release the bimetallic movable member.

Figure 16H:
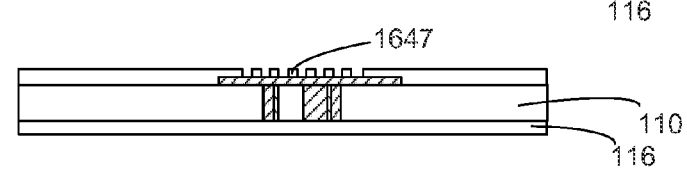

At FIG. 16h, processing has resulted in a release-lattice precursor 1646 such as a titanium nitride material that will have a different etch-selectivity response to that of the semiconductive substrate 110 and likewise a different etch-selectivity response to that of the sacrificial materials.

Figure 16K:
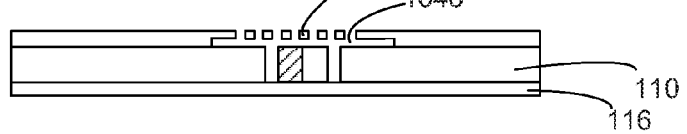
Figure 16M:
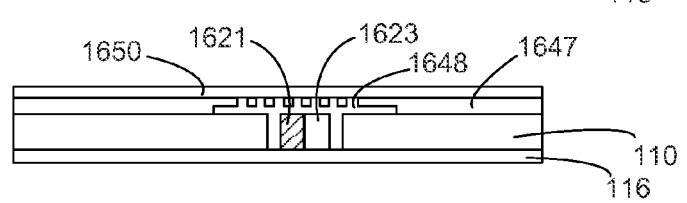

At FIG. 16k, processing has resulted in a patterned release-lattice layer 1647 such that the patterned sacrificial plate 1645 is exposable to a release process to achieve formation of the cavity 1648. Processing has resulted in a cavity 1648 that has released the bimetallic movable member, which consists of the first- and second components 11681 and 1683, respectively.

In an embodiment, a release process includes a plasma/dry etch removal of the sacrificial materials. In an embodiment, a release process includes a thermal release of the sacrificial materials. In an embodiment, a release process includes a wet etch of the sacrificial materials. In an embodiment, a release process includes a vapor etch of the sacrificial materials. In an embodiment, a release process includes thermal processing such that the patterned sacrificial plate 1645 and the sacrificial fill material 1642 are susceptible to removal by making them fugitive and allowing fugitive byproducts to vaporize and pass through the patterned release-lattice layer 1647, in an embodiment, thermal processing includes plasma vaporizing a low-k (equal to or less than that of silicon dioxide) sacrificial oxide that includes the patterned sacrificial plate 1645 and the sacrificial fill material such that a copper-tungsten bimetallic movable member 1622 or a copper-copper oxide bimetallic movable member 1622 is released.

In an embodiment, thermal processing includes $CF_4/O_2$, plasma etching of titanium sacrificial materials to leave a such that a copper-tungsten bimetallic movable member 1622 is released.

In an embodiment, a release process includes wet chemical processing such that the patterned sacrificial plate 1645 and the sacrificial fill material are susceptible to removal by wet-chemical dissolution that allows fugitive byproducts to dissolve and pass through the patterned release-lattice layer 1647. In an embodiment, wet-chemical processing includes dilute hydrofluoric acid (HF aq) wet rinsing of a sacrificial oxide that includes removal of the patterned sacrificial plate 1645 and the sacrificial fill material 1642 such that a copper-tungsten bimetallic movable member 1622 is released.

At 16m, processing has resulted in cavity sealing of the bimetallic movable members by forming a sealing layer 1650 over the patterned release-lattice layer 1647. In an embodiment, the sealing layer 1650 is a silicon nitride material that is deposited under conditions to bridge gaps in the patterned release-lattice layer 1647, but not to fin the cavity 1648. In a process embodiment, isotropic CVD of a silicon nitride material is carried out to form the sealing layer 1650.

In a resonator embodiment, the materials, lengths, widths, and heights of the movable member 1622 may be selected for useful natural resonator frequencies such as for a radio-frequency transmitter. Dimensions, including aspect ratios of the movable members 1622, are selected along with materials and spacings between the movable members and the electrodes, as well as electrode complexities in order to achieve useful resonator/switch/sensor embodiments. Additionally, formation of the movable members 1622 may be integrated into formation of the power/ground/signal TSV in order to reduce processes upon the TSV die 110.

Figure 17:
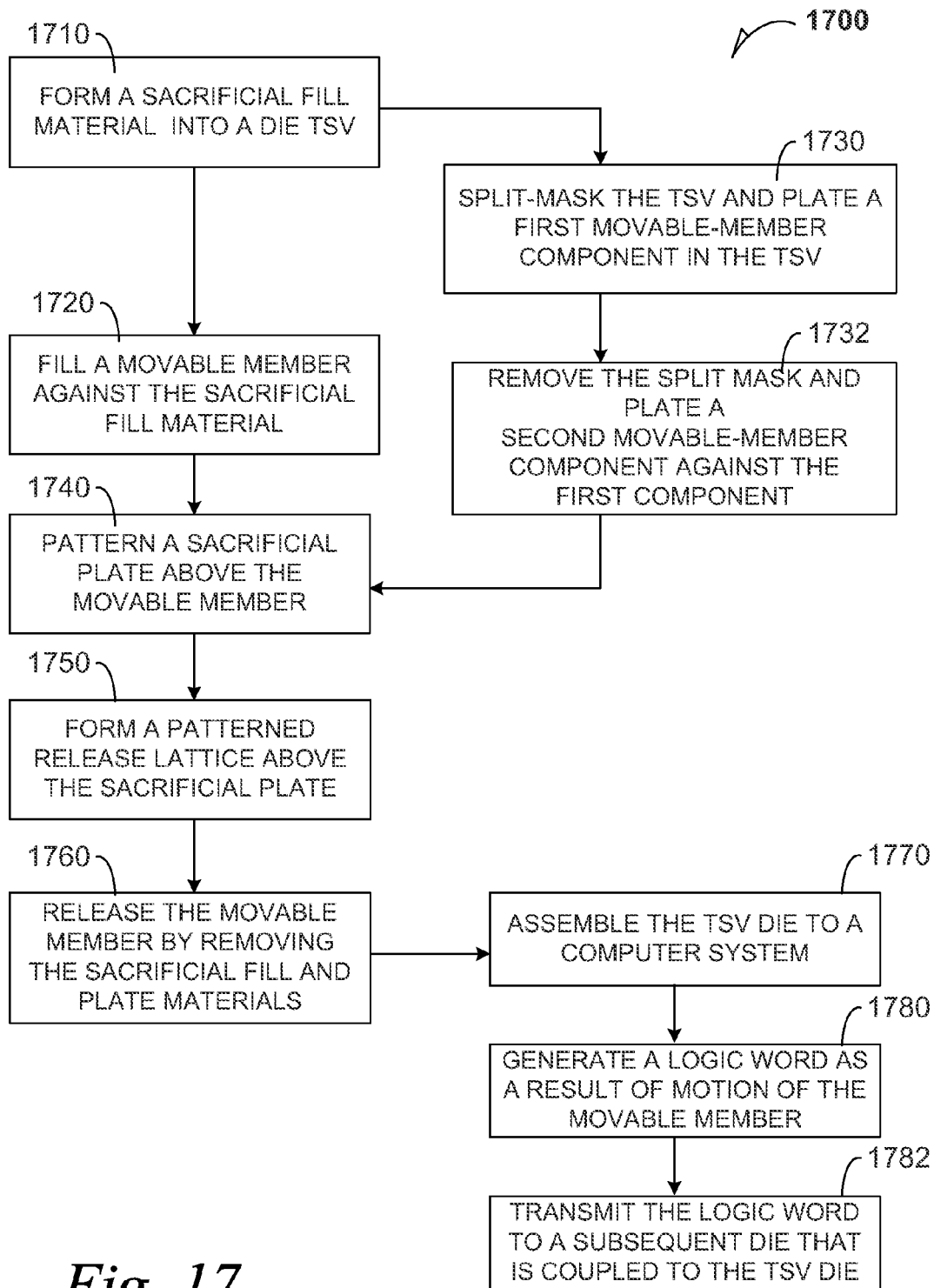
FIG. 17 is a process and method flow diagram according to several example embodiments.

FIG. 17 is a process and method flow diagram according to several example embodiments.

At 1710, the process includes forming a sacrificial fill material into a TSV of a die. In an non-limiting example embodiment, the sacrificial fill material 142, has been filled into patterned TSVs 118.

At 1720, the process includes filling a movable member against the sacrificial fill material. In a non-limiting example embodiment, the movable member 122 is filled against the sacrificial fill material 142.

At 1730, a process embodiment includes split-mask forming in the TSV and forming a first movable member component in the portion of the TSV that is open. In a non-limiting example embodiment, the TSV split mask 1662 partially fills the TSV 1618 and a bimetallic movable member first component 1681 has been plated into the TSV 1618 portion that is open.

At 1732, the process at 1730 continues by removing the split mask and forming a second movable member component against the first movable member component. In a non-limiting example embodiment, processing exhibits filling of the bimetallic movable member second component 1683 both against the sacrificial fill material 1660 and against the movable member first component 1681.

At 1740 processing may flow from either 1720 or 1732. At 1740, processing includes patterning a sacrificial plate above the movable member. In a non-limiting example embodiment, the patterned sacrificial plate 145 is formed over the sacrificial fill material 142 as well as the movable members 122.

At 1750, processing includes forming a patterned release lattice above the sacrificial plate. In a non-limiting example embodiment, processing has resulted in a patterned release-lattice layer 147 such that the patterned sacrificial plate 145 is exposable to a release process.

At 1760, processing includes releasing the movable member by removing the sacrificial fill and plate materials. In a non-limiting example embodiment, processing has resulted in a cavity 148 that has released the movable members 122.

At 1770, a method embodiment includes assembling the TSV die to a computer system. In a non-limiting example embodiment, the computer system depicted in FIG. 18 includes a TSV die with a movable member embodiment.

At 1780, a method embodiment includes generating a logic word as a result of motion of the movable member. In a non-limiting example embodiment, the bimetallic movable member 1422 depicted in FIG. 14*b* has moved to contact the electrode 1419 due to a temperature differential. In an embodiment, capacitative sensing detects the degree of bending of the bimetallic movable member 1422 although it may not have bent completely to close a circuit with the electrode 1419. In an embodiment, capacitative sensing is used to generate a logic word to slow down processing where the processor is heating above useful levels.

At 1782, the method includes transmitting the logic word to a subsequent die the is coupled to the TSV die. In a non-limiting example embodiment, the bimetallic movable member depicted in FIG. 14*b* has moved to contact the electrode 1419 due to a temperature differential, which results in a logic word being sent from the TSV die 1210 to a subsequent die such as the subsequent die 930. The logic word informs the subsequent die 930 of temperature change in the TSV die 910.

In a non-limiting example embodiment, voice communication switching such as GSM/CDMA uses a movable member embodiment as a resonator or a switch. In a non-limiting example embodiment, data-streaming communication switching such as GSM/CDMA uses a movable member embodiment as a resonator or a switch. For example, a resonator/switch embodiment may be used to enable hetero-data network toggling such as switching across domains like 3G/WiFi/WiMax/LTE where the logic die may adjust a useful data-bandwidth adjustment depending upon user location and accessible data infrastructure.

FIG. 18 is a schematic of a computer system according to an embodiment. The computer system 1800 (also referred to as the electronic system 1800) as depicted can embody a movable member contained in a TSV die according to any of the several disclosed embodiments and their equivalents as set forth in this disclosure. An apparatus that includes a movable member contained in a TSV die that is assembled to a computer system.

The computer system 1800 may be a smartphone. The computer system 1800 may be a tablet computer. The computer system 1800 may be a mobile device such as a notebook computer. The computer system 1800 may be a mobile device such as an ultrabook computer. The computer system 1800 may be a desktop computer. The computer system 1800 may be integral to an automobile. The computer system 1800 may be integral to a television. The computer system 1800 may be integral to a DVD player. The computer system 1800 may be integral to a digital camcorder.

In an embodiment, the electronic system 1800 is a computer system that includes a system bus 1820 to electrically couple the various components of the electronic system 1800. The system bus 1820 is a single bus or any combination of busses according to various embodiments. The electronic system 1800 includes a voltage source 1830 that provides power to an integrated circuit 1810. In some embodiments, the voltage source 1830 supplies current to the integrated circuit 1810 through the system bus 1820.

The integrated circuit 1810 is electrically coupled to the system bus 1820 and includes any circuit, or combination of circuits according to an embodiment. In an embodiment, the integrated circuit 1810 includes a processor 1812 that can be of any type of an apparatus that includes a movable member contained in a TSV die embodiment. As used herein, the processor 1812 may mean any type of device such as, but not limited to non-equivalent embodiments of a microprocessor, a microcontroller, a graphics processor, an SoC processor with graphics capabilities, a digital signal processor, an SoC processor with RF capabilities, or another processor. Other types of circuits that can be included in the integrated circuit 1810 are a custom circuit or an application-specific integrated circuit (ASIC), such as a communications circuit 1814 for use in non-equivalent wireless devices such as cellular telephones, smartphones, pagers, portable computers, two-way radios, and other electronic systems. In an embodiment, the processor 1810 includes on-die memory 1816 such as static random-access memory (SRAM). In an embodiment, the processor 1810 includes embedded on-die memory 1816 such as embedded dynamic random-access memory (eDRAM). Disclosed COB embodiments and their art-recognized equivalents are integral memory cells in the eDRAM.

In an embodiment, the integrated circuit 1810 is complemented with a subsequent integrated circuit 1811 such as in any LLI, LMI, or MMI embodiment as set forth in this disclosure. In an embodiment, the subsequent integrated circuit 1811 is as a graphics processor or a radio-frequency integrated circuit or both. In an embodiment, at least one passive device 1880 is coupled to the subsequent integrated circuit 1811 such that the integrated circuit 1811 and the at least one passive device are part of the any apparatus embodiment that includes a movable member contained in a TSV die that includes the integrated circuit 1810 and the integrated circuit 1811. In an embodiment, the at least one passive device is a sensor such as an accelerometer for a tablet or smartphone. In an embodiment, the passive device is a switch such as the bimetallic movable member embodiments.

In an embodiment, the electronic system 1800 includes an antenna element 1882 such as may be accessed, configured, or re-configured by any movable member contained in a TSV die embodiment set forth in this disclosure. By use of the antenna element 1882, a remote device 1884 such as a television, may be operated remotely through a wireless link by an apparatus embodiment. For example, an application on a smart telephone that operates through a wireless link broadcasts instructions to a television up to about 30 meters distant such as by Bluetooth® technology. In an embodiment, the remote device(s) includes a global positioning system of satellites for which the antenna element(s) are configured as receivers.

In an embodiment, the electronic system 1800 also includes an external memory 1840 that in turn may include one or more memory elements suitable to the particular application, such as a main memory 1842 in the form of RAM, one or more hard drives 1844, and/or one or more drives that handle removable media 1846, such as diskettes, compact disks (CDs), digital variable disks (DVDs), flash memory drives, and other removable media known in the art. In an embodiment, the external memory 1840 is part of a POP package that is stacked upon an apparatus that includes a movable member contained in a TSV die according to any disclosed embodiments. In an embodiment, the external memory 1840 is embedded memory 1848 such an apparatus that includes a movable member contained in a TSV die according to any disclosed embodiment.

In an embodiment, the electronic system 1800 also includes a display device 1850, and an audio output 1860. In an embodiment, the electronic system 1800 includes an input device such as a controller 1870 that may be a keyboard, mouse, touch pad, keypad, trackball, game controller, microphone, voice-recognition device, or any other input device that inputs information into the electronic system 1800. In an embodiment, an input device 1870 includes a camera. In an embodiment, an input device 1870 includes a digital sound recorder. In an embodiment, an input device 1870 includes a camera and a digital sound recorder.

A foundation substrate 1890 may be part of the computing system 1800. The foundation substrate 1890 is a motherboard that supports an apparatus that includes a movable member contained in a TSV die embodiment. In an embodiment, the foundation substrate 1890 is a board which supports an apparatus that includes a movable member contained in a TSV die embodiment. In an embodiment, the foundation substrate 1890 incorporates at least one of the functionalities encompassed within the dashed line 1890 and is a substrate such as the user shell of a wireless communicator.

As shown herein, the integrated circuit 1810 can be implemented in a number of different embodiments, an apparatus that includes a movable member contained in a TSV die according to any of the several disclosed embodiments and their equivalents, an electronic system, a computer system, one or more methods of fabricating an integrated circuit, and one or more methods of fabricating and assembling an apparatus that includes a movable member contained in a TSV die according to any of the several disclosed embodiments as set forth herein in the various embodiments and their art-recognized equivalents. The elements, materials, geometries, dimensions, and sequence of operations can all be varied to suit particular I/O coupling requirements including movable member contained in a TSV die embodiments and their equivalents.

Although a die may refer to a processor chip, an RE chip, an RFIC chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A through-silicon via (TSV) microelectronic die, comprising:
    an active surface and a backside surface;
    a movable member disposed in the TSV that has a fixed first end at a location closer to the active surface than to the backside surface and that has a free end at a location closer to the backside surface than to the active surface; and
    a fixed electrode disposed in the TSV closer to the free end, wherein the fixed electrode is capable of moving the free end, or the fixed electrode is capable of sensing motion of the free end, wherein the movable member is a bimetallic structure including a first component and a second component.

2. A through-silicon via (TSV) microelectronic die, comprising:
    an active surface and a backside surface;
    a movable member disposed in the TSV that has a fixed first end at a location closer to the active surface than to the backside surface and that has a free end at a location closer to the backside surface than to the active surface; and
    a fixed electrode disposed in the TSV closer to the free end, wherein the fixed electrode is capable of moving the free end, or the fixed electrode is capable of sensing motion of the free end wherein the fixed electrode is a first metal electrode that is disposed in the TSV periphery at the die backside surface at a first side of the TSV, and further including:
    a second metal electrode that is disposed in the TSV periphery at a second side of the TSV that is opposite the first metal electrode; and
    a supplemental electrode disposed in the TSV periphery at a location between the free end and the fixed end and wherein the first metal electrode is closer to the first end than the supplemental electrode.

3. A through-silicon via (TSV) die package including a TSV die, the package comprising a bumpless, build-up layer coreless (BBUL-C) substrate and the TSV die embedded in the BBUL-C substrate, wherein the TSV die includes:
an active surface and a backside surface;
a movable member disposed in the TSV that has a fixed first end at a location closer to the active surface than to the backside surface and that has a free end at a location closer to the backside surface than to the active surface; and
a fixed electrode disposed in the TSV at the TSV periphery that is closer to the free end, wherein the fixed electrode is capable of moving the free end, or the fixed electrode is capable of sensing motion of the free end, wherein the movable member is a bimetallic structure including a first component and a second component.

4. An apparatus comprising:
a die including a through-silicon via (TSV) disposed therein, the die including an active surface and a backside surface;
a movable member disposed in the TSV, wherein the movable member includes a fixed end and a free end; and
a fixed electrode disposed at the backside surface and at the TSV in the periphery of the TSV, wherein the movable member is a bimetallic structure including a first component and a second component.

5. A through-silicon via (TSV) microelectronic die, comprising:
an active surface and a backside surface;
a movable member disposed in the TSV that has a fixed first end at a location closer to the active surface than to the backside surface and that has a free end at a location closer to the backside surface than to the active surface;
a fixed electrode disposed in the TSV closer to the free end, wherein the electrode is capable of moving the free end, or the electrode is capable of sensing motion of the free end, wherein the fixed electrode is a metal electrode that is disposed in the TSV at the die backside surface; and
a coreless, bumpless build-up layer (BBUL-C) substrate in which the microelectronic die is disposed, wherein the movable member is a bimetallic structure including a first component and a second component.

6. A through-silicon via (TSV) microelectronic die, comprising:
an active surface and a backside surface;
a movable member disposed in the TSV that has a fixed first end at a location closer to the active surface than to the backside surface and that has a free end at a location closer to the backside surface than to the active surface;
a fixed electrode disposed in the TSV closer to the free end, wherein the fixed electrode is capable of moving the free end, or the fixed electrode is capable of sensing motion of the free end, wherein the fixed electrode is a metal electrode that is disposed in the TSV at the die backside surface; and
a coreless, bumpless build-up layer (BBUL-C) substrate in which the microelectronic die is disposed, wherein the electrode is a first metal electrode that is disposed in the TSV periphery at the die backside surface at a first side of the TSV, and further including:
a second metal electrode that is disposed in the TSV periphery at a second side of the TSV that is opposite the first metal electrode; and
a supplemental electrode disposed in the TSV periphery at a location between the free end and the fixed end and wherein the first metal electrode is closer to the first end than the supplemental electrode.

7. An apparatus comprising:
a die including a through-silicon via (TSV) disposed therein, the die including an active surface and a backside surface;
a movable member disposed in the TSV, wherein the movable member includes a fixed end and a free end;
a fixed electrode disposed at the backside surface and at the TSV in the periphery of the TSV, wherein the fixed electrode is a metal electrode that is disposed in the TSV at the die backside surface; and
a coreless, bumpless build-up layer (BBUL-C) substrate in which the die is disposed, wherein the movable member is a bimetallic structure including a first component and a second component.

\* \* \* \* \*